(12) United States Patent
Zhang

(10) Patent No.: US 12,082,472 B2
(45) Date of Patent: Sep. 3, 2024

(54) COLOR FILTER SUBSTRATE, MANUFACTURING METHOD THEREOF, AND DISPLAY PANEL

(71) Applicant: Shenzhen China Star Optoelectronics Semiconductor Display Technology Co., Ltd., Guangdong (CN)

(72) Inventor: Liangfen Zhang, Guangdong (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 866 days.

(21) Appl. No.: 17/054,536

(22) PCT Filed: Oct. 23, 2020

(86) PCT No.: PCT/CN2020/123207
§ 371 (c)(1),
(2) Date: Nov. 11, 2020

(87) PCT Pub. No.: WO2022/047929
PCT Pub. Date: Mar. 10, 2022

(65) Prior Publication Data
US 2022/0320181 A1    Oct. 6, 2022

(30) Foreign Application Priority Data
Sep. 7, 2020  (CN) .......................... 202010927053.3

(51) Int. Cl.
*H10K 59/122*  (2023.01)
*G02F 1/1335*  (2006.01)
(Continued)

(52) U.S. Cl.
CPC ....... *H10K 59/38* (2023.02); *G02F 1/133512* (2013.01); *G02F 1/133516* (2013.01);
(Continued)

(58) Field of Classification Search
CPC ............. H01L 27/146; H01L 27/14601; H01L 27/14603; H01L 27/1462; H01L 27/14621;
(Continued)

(56) References Cited

U.S. PATENT DOCUMENTS 9,231,035 B2 *  1/2016  Kim ........................ H10K 59/00
10,886,489 B2 *  1/2021  Lee ....................... H10K 59/131
(Continued)

FOREIGN PATENT DOCUMENTS

CN  109300395  2/2019
CN  110085638  8/2019
(Continued)

*Primary Examiner* — Eduardo A Rodela

(57) ABSTRACT

A color filter substrate, a manufacturing method thereof, and a display panel are provided. The color filter substrate includes a first substrate, a color resist layer, an overcoat layer, and a quantum dot layer, which are sequentially stacked. The color resist layer includes a plurality of sub-color resist layers with different colors arranged along a second direction, and there is no black matrix disposed between two adjacent sub-color resist layers. The quantum dot layer is divided into a plurality of quantum dot areas arranged along the second direction. A plurality of banks are disposed between and correspond to two adjacent quantum dot areas, and the banks are black.

17 Claims, 4 Drawing Sheets

(51) Int. Cl.
 *H10K 50/86* (2023.01)
 *H10K 59/38* (2023.01)
 *H10K 71/00* (2023.01)

(52) U.S. Cl.
 CPC ......... *H10K 50/865* (2023.02); *H10K 59/122* (2023.02); *H10K 71/00* (2023.02)

(58) Field of Classification Search
 CPC ......... H01L 27/14623; H01L 27/14625; H01L 27/1463; H01L 27/14645; H10K 59/38; H10K 50/865; H10K 59/122; H10K 71/00; H10K 59/173; H10K 59/30; G02F 1/133512; G02F 1/133516
 See application file for complete search history.

(56) References Cited

U.S. PATENT DOCUMENTS

| | | | |
|---|---|---|---|
| 11,088,216 B2* | 8/2021 | Bae | H10K 59/878 |
| 11,387,286 B2* | 7/2022 | Kim | H10K 59/122 |
| 11,569,467 B2* | 1/2023 | Jung | H10K 71/00 |
| 2017/0373124 A1* | 12/2017 | Yang | H10K 59/12 |
| 2018/0204893 A1* | 7/2018 | Hiraga | H10K 50/85 |
| 2022/0246684 A1* | 8/2022 | Kim | H10K 59/122 |

FOREIGN PATENT DOCUMENTS

| | | |
|---|---|---|
| CN | 111326562 | 6/2020 |
| CN | 111341939 | 6/2020 |

\* cited by examiner

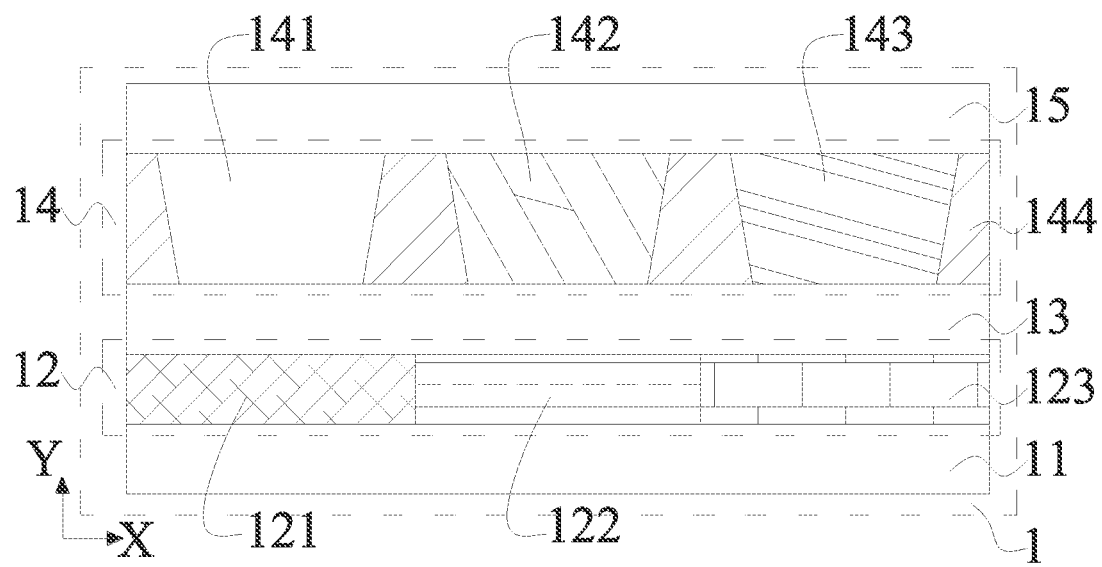
FIG. 1
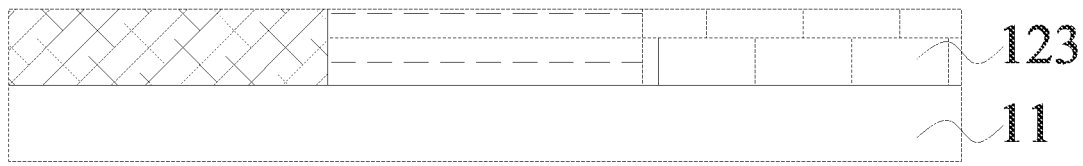
FIG. 1A
FIG. 1B
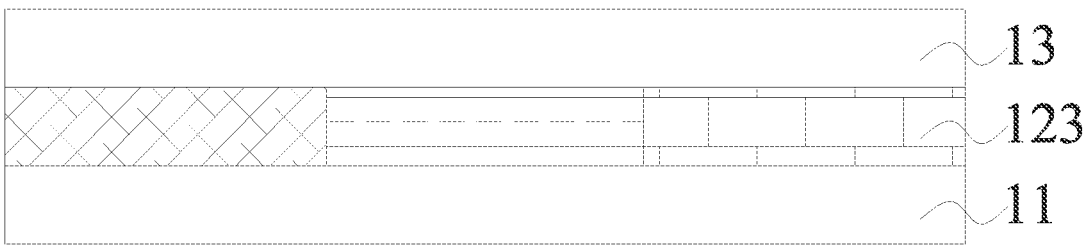
FIG. 1C

COLOR FILTER SUBSTRATE, MANUFACTURING METHOD THEREOF, AND DISPLAY PANEL

RELATED APPLICATIONS

This application is a National Phase of PCT Patent Application No. PCT/CN2020/123207 having International filing date of Oct. 23, 2020, which claims the benefit of priority of Chinese Patent Application No. 202010927053.3 filed on Sep. 7, 2020. The contents of the above applications are all incorporated by reference as if fully set forth herein in their entirety.

FIELD AND BACKGROUND OF THE INVENTION

The present disclosure relates to the field of display technologies, and more particularly, relates to a color filter substrate, a manufacturing method thereof, and a display panel.

With development of display panel industry, manufacturing methods of organic light-emitting diode (OLED) panels are following a trend toward lower cost and higher luminescent efficiency. Typically, luminescent efficiency of the organic light-emitting diode panels can be improved by disposing some quantum dots therein. Due to high ink usage and high luminescent efficiency, quantum dot printing technologies have attracted many companies in the industry.

Nowadays, a color filter in OLEDs is designed based on a color filter in liquid crystal displays (LCDs). The color filter in the LCDs is generally formed on an encapsulation cover plate and includes a plurality of black matrices, a red color resist layer, a green color resist layer, a blue color resist layer, and an overcoat layer. The black matrices are disposed at two ends of each of the red color resists, the green color resists, and the blue color resists to block light, thereby solving a problem of light leakage between color resist layers in the overcoat layer of the color filter substrate.

However, although the problem of light leakage between color resist layers can be solved by having side light be absorbed by the black matrices disposed between the red color resists, the green color resists, and the blue color resists, light actually emitted from the OLEDs is reduced because a portion of light is lost.

Therefore, a following problem of conventional display panel technologies urgently needs to be solved: a portion of light in display panels is absorbed by black matrices between red color resists, green color resists, and blue color resists of a color filter substrate, leading to loss of light, causing technical difficulties, and increasing manufacturing costs of the display panels.

SUMMARY OF THE INVENTION

The present disclosure relates to a color filter substrate, a manufacturing method thereof, and a display panel, and solves a following problem of conventional technologies: a portion of light in display panels is absorbed by black matrices between red color resists, green color resists, and blue color resists of a color filter substrate, leading to loss of light, causing technical difficulties, and increasing manufacturing costs of the display panels.

To solve the above problem, technical solutions provided by the present disclosure is described below.

The present disclosure provides a color filter substrate, including a first substrate, a color resist layer, an overcoat layer, and a quantum dot layer, which are sequentially stacked along a first direction.

The color resist layer is provided with a plurality of sub-color resist layers with different colors arranged along a second direction, and there is no black matrix disposed between two adjacent color resist layers; and The quantum dot layer is divided into a plurality of quantum dot areas arranged along the second direction, a plurality of banks are disposed between and correspond to two adjacent quantum dot areas, and the banks are black.

In some embodiments, a material of the banks includes a hydrophobic organic material, and the banks have a predetermined length along the first direction.

In some embodiments, the predetermined length of the banks along the first direction is a first length L greater than 6 μm.

In some embodiments, the banks have a predetermined transmittance τ within a visible light range, the predetermined transmittance τ of the banks is less than 5% when a wavelength of ambient light L is greater than 350 nm and less than 510 nm, and the predetermined transmittance τ of the banks is greater than 90% when the wavelength of ambient light L is greater than 650 nm.

In some embodiments, each of the quantum dot areas is divided into a first quantum dot area, a second quantum dot area, and a third quantum dot area.

In some embodiments, a red quantum dot is disposed in the first quantum dot area, a green quantum dot is disposed in the second quantum dot area, and the third quantum dot area is not provided with a quantum dot.

In some embodiments, a red quantum dot is disposed in the first quantum dot area, a green quantum dot is disposed in the second quantum dot area, and a transparent resin material is disposed in the third quantum dot area.

In some embodiments, the sub-color resist layers include a first color resist layer, a second color resist layer, and a third color resist layer.

In some embodiments, the first quantum dot area corresponds to the first color resist layer, the second quantum dot area corresponds to the second color resist layer, and the third quantum dot area corresponds to the third color resist layer.

In some embodiments, the first color resist layer is a red color resist layer, the second color resist layer is a green color resist layer, and the third color resist layer is a blue color resist layer.

In some embodiments, a material of the overcoat layer includes a transparent organic material.

The present disclosure provides a method of manufacturing a color filter substrate, including following steps:

S10: providing a first substrate;
S20: forming a color resist layer on a side of the first substrate, wherein the color resist layer includes a plurality of different colors;
S30: forming an overcoat layer on a side of the first substrate away from the color resist layer, wherein a material of the overcoat layer includes a transparent organic material;
S40: depositing a quantum dot layer on a side of the first substrate away from the overcoat layer, wherein the quantum dot layer is divided into three quantum dot areas, a plurality of banks are disposed between adjacent quantum dot areas; printing a red quantum dot material in a first quantum dot area by inkjet printing, printing a green quantum dot material in a second quantum dot area by inkjet printing, and filling or printing a transparent resin material in the third quantum dot area.

In some embodiments, the first substrate is a glass substrate or a resin substrate.

The present disclosure further provides a display panel, including a luminescent device and the above color filter substrate corresponding to the luminescent device, wherein the luminescent device emits blue light or white light.

In some embodiments, the luminescent device includes a second substrate, a buffer layer, a first insulating layer, a passivation layer, a first overcoat layer, a pixel defining layer, a luminescent layer, an encapsulation layer, and a second overcoat layer, which are sequentially stacked along the first direction.

In some embodiments, a light-shielding layer, an active layer, a second insulating layer, and a first metal layer are disposed in the first insulating layer.

In some embodiments, a second metal layer is disposed in the passivation layer, and a source and a drain of the second metal layer are electrically connected to the active layer by a first through-hole and a second through-hole respectively, and an end of the drain is electrically connected to an anode by a third through-hole.

In some embodiments, an anode layer is disposed on a side of the first overcoat layer away from the passivation layer, and the anode layer is surrounded by the pixel defining layer.

In some embodiments, the luminescent layer is disposed on a side of the anode layer away from the second substrate, and the luminescent layer is surrounded by the pixel defining layer.

In some embodiments, the luminescent layer is an organic light-emitting diode (OLED) device or a liquid crystal display (LCD) device.

Compared with the conventional technologies, the color filter substrate, the manufacturing method thereof, and the display panel have following beneficial effects:

1. The present disclosure provides a color filter substrate, including a first substrate, a color resist layer, an overcoat layer, and a quantum dot layer, which are sequentially stacked along a first direction. The color resist layer includes a plurality of sub-color resist layers with different colors arranged along a second direction. There is no black matrix disposed between two adjacent sub-color resist layers. The quantum dot layer is divided into a plurality of quantum dot areas along a second direction. A plurality of banks are disposed between two adjacent quantum dot areas and are black. As a result, loss of light in the display panel, technical difficulties, and manufacturing costs are reduced.

2. Furthermore, because the banks are disposed between two adjacent quantum dot areas and are black, light leakage from a luminescent area is prevented. Moreover, a predetermined length of the banks along the first direction is a first length L greater than 6 μm, which satisfies printing thickness requirements of the quantum dot layer.

3. In the display panel provided by the present disclosure, a luminescent device can emit not only blue light, but also white light, and both the above two lights can excite red quantum dots and green quantum dots in a quantum dot layer 14, which increases contrast of light emitted from the display panel.

4. In addition, the luminescent device may be an OLED or an LCD. A selection of the luminescent device is diverse, and an arrangement of the luminescent device is simple.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

FIG. 1 is a structural schematic view showing a color filter substrate provided by an embodiment of the present disclosure.

FIGS. 1A, 1B, 1C, 1D, 1E and 1F are schematic views showing the color filter substrate manufactured by a method provided by an embodiment of the present disclosure in different steps.

DESCRIPTION OF SPECIFIC EMBODIMENTS OF THE INVENTION

Figure 1D:
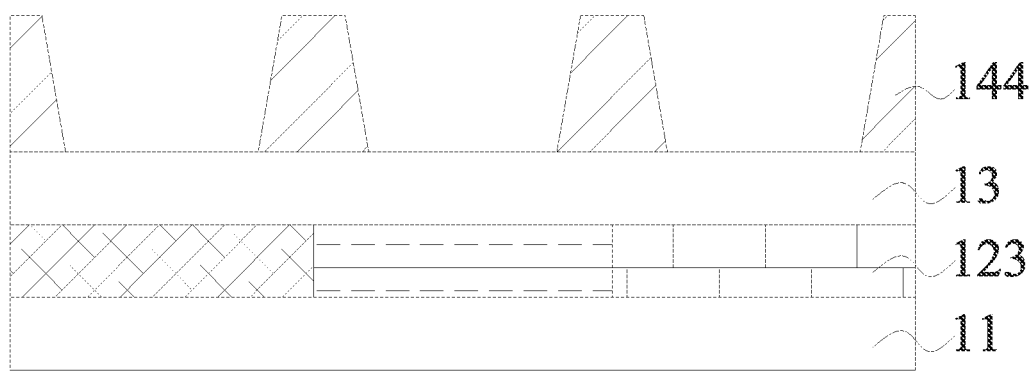

Hereinafter a preferred embodiment of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

The present disclosure provides a color filter substrate, a manufacturing method thereof, and a display panel, which can be specifically referred to FIGS. 1 to 4.

Nowadays, a color filter in OLEDs is designed based on a color filter in liquid crystal displays (LCDs). The color filter in the LCDs is generally formed on an encapsulation cover plate and includes a plurality of black matrices, a red color resist layer, a green color resist layer, a blue color resist layer, and an overcoat layer. The black matrices are disposed at two ends of each of the red color resists, the green color resists, and the blue color resists to block light, thereby solving a problem of light leakage between color resist layers in the overcoat layer of the color filter substrate. However, although the problem of light leakage between color resist layers can be solved by having side light be absorbed by the black matrices disposed between the red color resists, the green color resists, and the blue color resists, light actually emitted from the OLEDs is reduced because a portion of light is lost. Therefore, the present disclosure provides a color filter substrate, a manufacturing method thereof, and a display panel to solve the above problem.

Figure 1E:
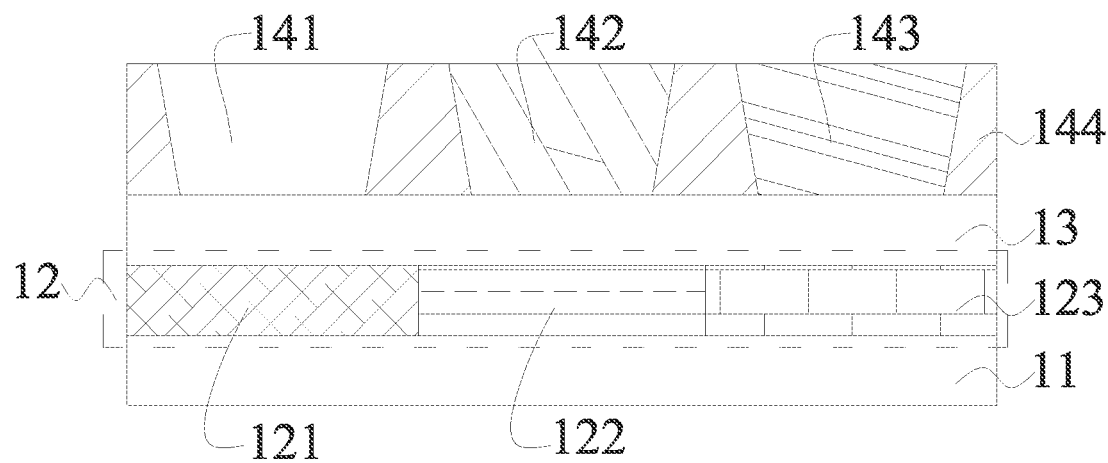
Figure 1F:
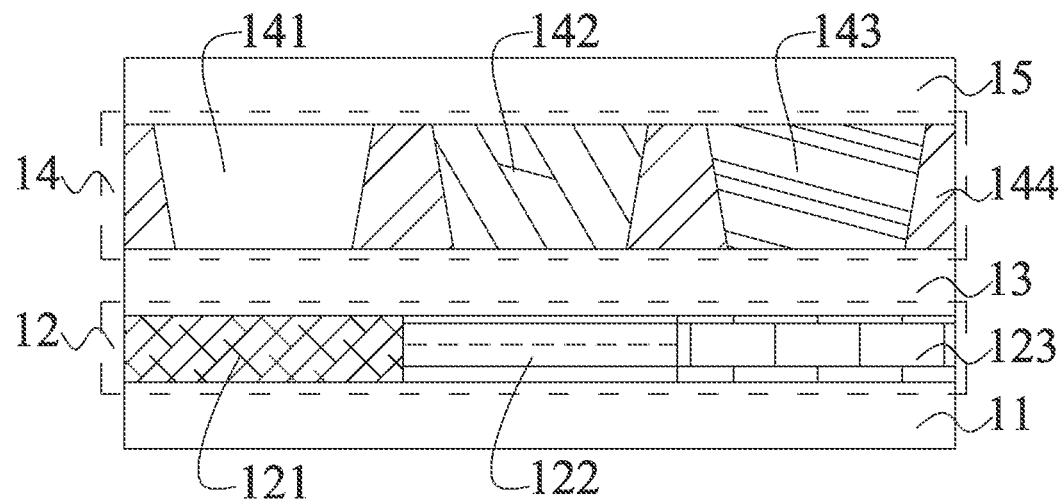
Figure 2:
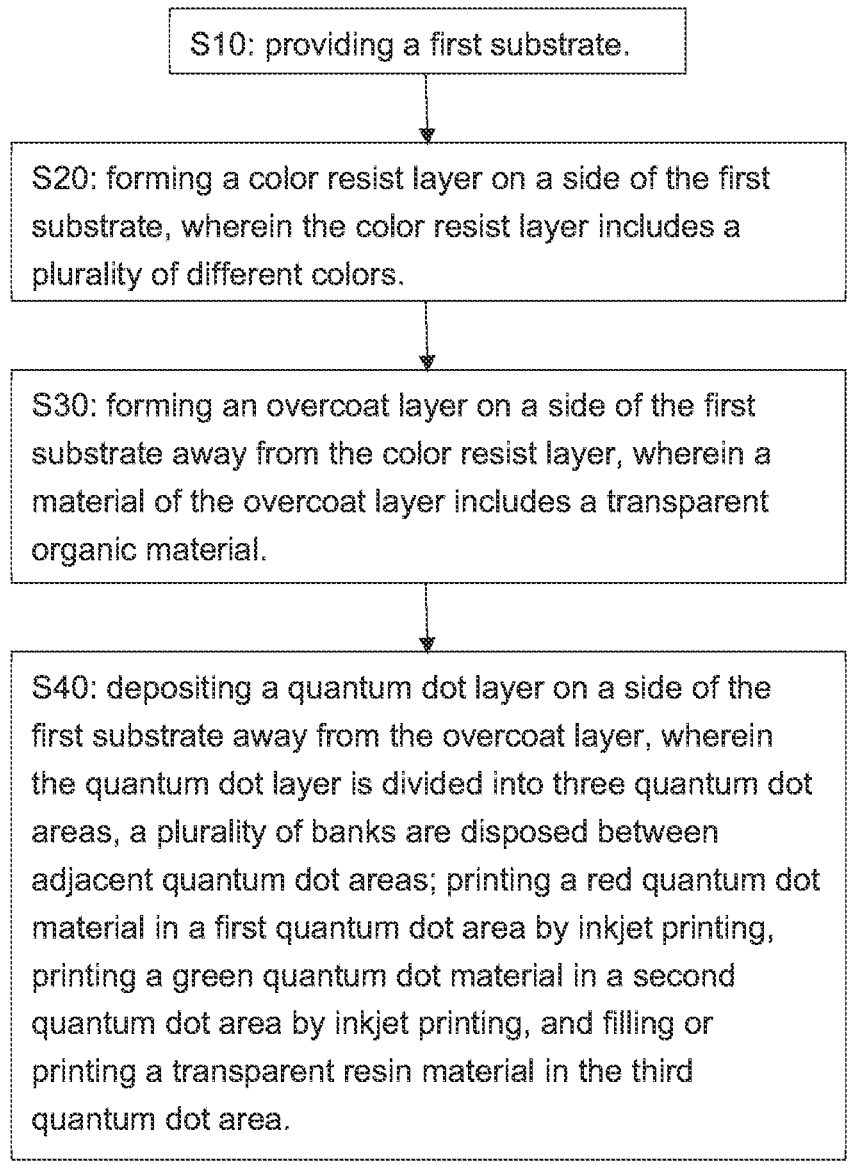
FIG. 2 is a schematic flowchart showing the manufacturing method of the color filter substrate provided by an embodiment of the present disclosure.
Figure 3:
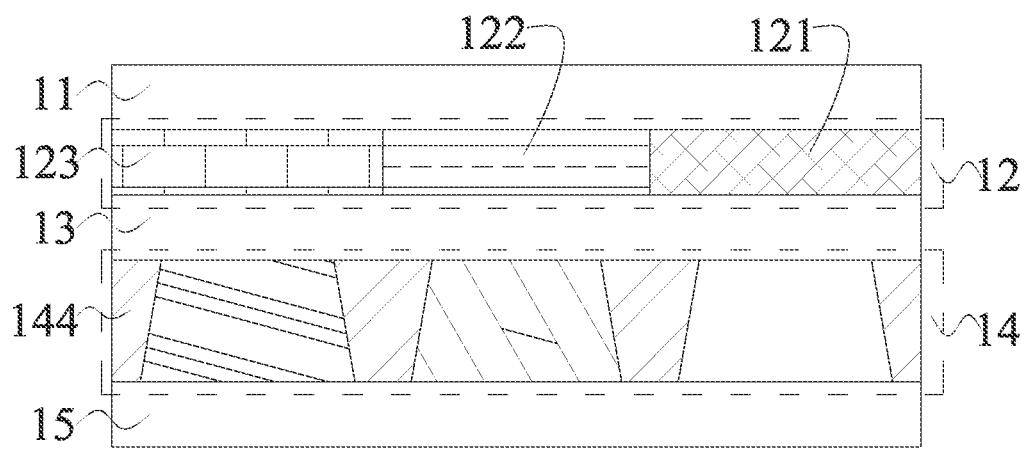
FIG. 3 is a structural schematic view showing a display panel provided by an embodiment of the present disclosure.

Please refer to FIG. 1, a structural schematic view showing an array substrate is provided. The present disclosure provides a color filter substrate 1, and a first substrate 11, a color resist layer 12, an overcoat layer 13, and a quantum dot layer 14, which are stacked on the color filter substrate 1 along a first direction (vertical Y-direction). The color resist layer 12 includes a plurality of sub-color resist layers with different colors arranged along a second direction (horizontal X-direction), and there is no black matrix disposed between two adjacent sub-color resist layers. The quantum dot layer 14 is divided into a plurality of quantum dot areas arranged along the second direction (X). A plurality of banks 144 are disposed between and correspond to two adjacent quantum dot areas. The banks 144 are black. That is, a black matrix conventionally disposed between the sub-color resist layers is omitted, so that a process can be omitted and costs are reduced. Furthermore, in the color filter substrate 1 provided by the present disclosure, the quantum dot layer 14 is disposed on a side of the color resist layer 12 away from the first substrate 11 and is configured to increase contrast of emitted light. In addition, the black banks 144 are disposed between two adjacent quantum dot areas and has several functions in two aspects: in one aspect, the banks 144 can be a plurality of spacers around the quantum dot areas, which define each of the quantum dot areas and a luminescent area of pixels. In the other aspect, because the banks 144 are disposed between two adjacent quantum dot areas, light with different colors emitted from different quantum dot areas is prevented from being mixed with each other. In addition, because the banks 144 correspond to two adjacent sub-color resist layers, a color mixing phenomenon can also be prevented from occurring between two adjacent sub-color resist layers.

Furthermore, a material of the banks 144 includes a hydrophobic organic material. The banks 144 have a predetermined length along the first direction (Y), and the predetermined length is a first length L greater than 6 μm. In addition, the length of the banks 144 along the first direction (Y) is greater than a length of the sub-color resist layers along the first direction (Y). The banks 144 with a height greater than 6 μm have several functions in two aspects: in one aspect, because the banks 144 are relatively high, ink is easy to be printed on each of the quantum dot areas. In the other aspect, the higher the banks 144, the more light emitted (laterally or sideways) into a bottom of the display panel, and the less the possibility of the color mixing phenomenon occurring between two adjacent sub-color resist layers.

In one embodiment of the present disclosure, the quantum dot area 14 is divided into a first quantum dot area 141, a second quantum dot area 142, and a third quantum dot area 143. A red quantum dot is disposed in the first quantum dot area 141, a green quantum dot is disposed in the second quantum dot area 142, and the third quantum dot area 143 is not provided with a quantum dot. In other words, the quantum dot area 143 is an empty cavity.

In another embodiment of the present disclosure, the red quantum dot is disposed in the first quantum dot area 141, the green quantum dot is disposed in the second quantum dot area 142, and a transparent resin material is disposed in the third quantum area 143. In other words, the third quantum dot area 143 is not the empty cavity, and is provided with the transparent resin material which will not affect light directly entering the color resist layer 12.

Moreover, the color resist layer 12 includes a plurality of sub-color resist layers with different colors, namely a first color resist layer 121, a second color resist layer 122, and a third color resist layer 123. The first quantum dot area 141 corresponds to the first color resist layer 121, the second quantum dot area 142 corresponds to the second color resist layer 122, and the third quantum dot area 143 corresponds to the third color resist layer 123. The first color resist layer 121 is a red color resist layer, the second color resist layer 122 is a green color resist layer, and the third color resist layer 123 is a blue color resist layer. When light enters the color filter substrate 1 from the bottom of the display panel, the contrast of light emitted from the display panel is increased due to the quantum dot layer 14 and the color resist layer 12.

In one embodiment of the present disclosure, a material of the overcoat layer 13 includes a transparent organic material such as silicon oxide. Transmittance of the color resist layer 12 may be the highest when the silicon oxide material is applied.

In some embodiments of the present disclosure, the banks 144 have a predetermined transmittance $\tau$ within a visible light range, the predetermined transmittance $\tau$ of the banks 144 is less than 5% when a wavelength of ambient light L is greater than 350 nm and less than 510 nm, the predetermined transmittance $\tau$ of the banks is greater than 90% when the wavelength of ambient light L is greater than 650 nm.

The present disclosure provides a method of manufacturing a color filter substrate, including following steps:

S10: providing a first substrate 11, wherein the first substrate 11 may be a glass substrate or a resin substrate, as shown in FIG. 1A;

S20: depositing a color resist layer 12 on a side of the first substrate 11, wherein the color resist 12 includes a plurality of different colors, i.e., the color resist layer 12 includes a first color resist layer 121, a second color resist layer 122, and a third color resist layer 123, the first color resist layer 121 is a red color resist layer, the second color resist layer 122 is a green color resist layer, and the third color resist layer 123 is a blue color resist layer, as shown in FIG. 1B;

S30: forming an overcoat layer 13 on a side of the substrate 11 away from the color resist layer 12, wherein a material of the overcoat layer 13 includes a transparent organic material, thereby maximally reducing loss of light entering the color resist layer, and ensuring luminescent efficiency of the color filter substrate, as shown in FIG. 1C;

S40: depositing a quantum dot layer 14 on a side of the substrate 11 away from the overcoat layer 13, wherein the quantum dot layer 14 is divided into three quantum dot areas, and a plurality of banks 144 are disposed between the quantum dot areas; printing a red quantum dot material in the first quantum dot area 141, printing a green quantum dot material in the second quantum dot area 142, wherein a transparent resin material is not filled in or printed in the third quantum dot area, an aim of disposing the quantum dot layer 14 is to excite a quantum dot material by light entering from the bottom of the display panel, thereby maximally increasing contrast of light emitted from the color filter substrate 1 by using the quantum dot material combined with the color resist layer 12.

The present disclosure further provides a display panel, including a luminescent device 2 and the above color filter substrate 1 corresponding to the luminescent device 2, wherein the luminescent device 2 emits blue light or white light.

Figure 4:
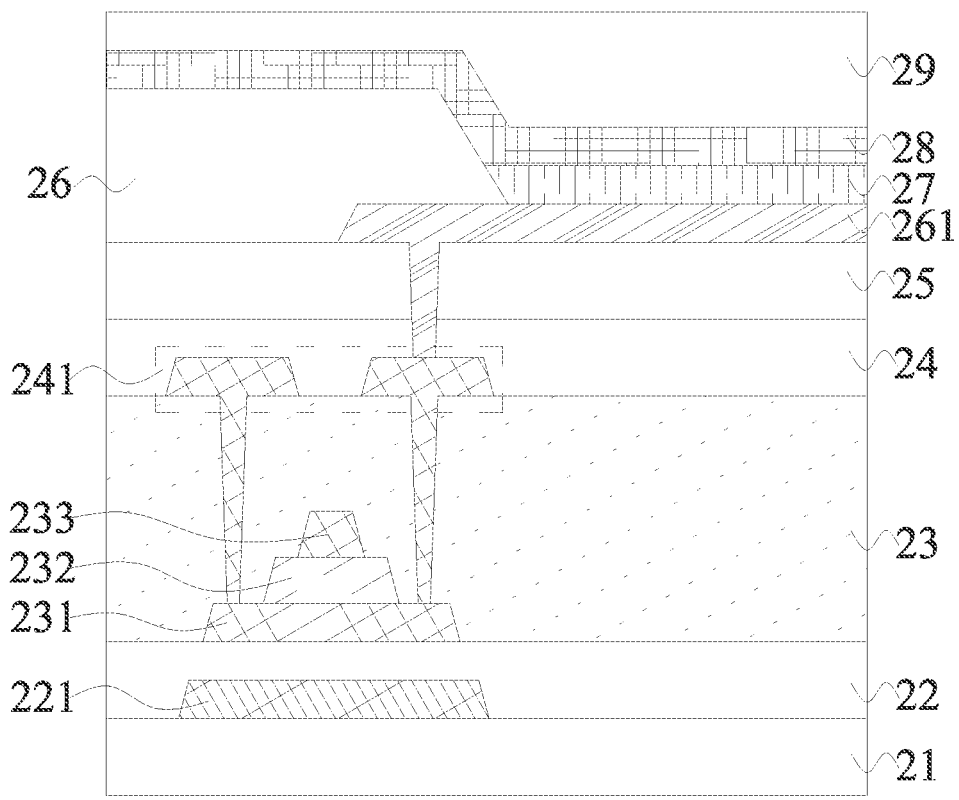
FIG. 4 is a structural schematic view showing an array substrate provided by an embodiment of the present disclosure.

Furthermore, as shown in FIG. 4, the luminescent device 2 includes a second substrate 21, a buffer layer 22, a first insulating layer 23, a passivation layer 24, a first overcoat layer 25, a pixel defining layer 26, a luminescent layer 27, an encapsulation layer 28, and a second overcoat layer 29, which are sequentially stacked along a first direction (Y).

Furthermore, a light-shielding layer 221 is disposed in the first insulating layer 23 and is configured to block light emitted into an active layer 231, thereby preventing polysilicon in the active layer 231 from damage due to light entering the active layer 231, and preventing stability of a thin-film transistor from being affected. The active layer 231, a second insulating layer 232, and a first metal layer 233 are further disposed in the first insulating layer 23. A second metal layer 241 is disposed in the passivation layer 24. A source and a drain of the second metal layer 241 are electrically connected to the active layer 231 by a first through-hole and a second through-hole respectively, and an end of the drain is electrically connected to an anode layer 261 by a third through-hole. The anode layer 261 is disposed on a side of the first overcoat layer 25 away from the passivation layer 24, and is surrounded by the pixel defining layer 26. Therefore, a luminescent area of the luminescent layer of the display panel is defined.

Furthermore, the luminescent layer 27 is disposed on a side of the anode layer 261 away from the second substrate 21, and is also surrounded by the pixel defining layer 26. In one embodiment, the luminescent layer 27 may be an OLED luminescent device, including a hole transport layer, an organic luminescent layer, an electron transport layer, and a metal cathode. In another embodiment, the luminescent layer 27 may also be an LED luminescent device.

Furthermore, in one embodiment, the luminescent layer 27 may emit blue light. When blue light is emitted into the quantum dot layer, the red quantum dot and the green quantum dot in the quantum dot layer 14 can be better excited. In addition, luminescent efficiency of the display panel can be improved due to the first color resist layer 121, the second color resist layer 122, and the third color resist layer 123. In another embodiment, the luminescent layer 27 may also emit white light. Because white light includes a spectrum of blue light, it also can excite the red quantum dot and the green quantum dot in the quantum dot layer 14. Then, light passes through the first color resist layer 121, the second color resist layer 122, and the third color resist layer 123.

Regarding the beneficial effects: the present disclosure provides a color filter substrate, including a first substrate, a color resist layer, an overcoat layer, and a quantum dot layer, which are sequentially stacked along a first direction. The color resist layer includes a plurality of sub-color resist layers with different colors arranged along a second direction. There is no black matrix disposed between two adjacent sub-color resist layers. The quantum dot layer is divided into a plurality of quantum dot areas along a second direction. A plurality of banks are disposed between two adjacent quantum dot areas and are black. As a result, loss of light in the display panel, technical difficulties, and manufacturing costs are reduced. Furthermore, because the banks are disposed between two adjacent quantum dot areas and are black, light leakage from a luminescent area is prevented. Moreover, a predetermined length of the banks along the first direction is a first length L greater than 6 μm, which satisfies printing thickness requirements of the quantum dot layer. In addition, in the display panel provided by the present disclosure, a luminescent device can emit not only blue light, but also white light, and both the above two light can excite red quantum dots and green quantum dots in a quantum dot layer 14, which increases contrast of light emitted from the display panel. Furthermore, the luminescent device may be an OLED or an LCD. A selection of the luminescent device is diverse, and an arrangement of the luminescent device is simple.

A color filter substrate, a manufacturing method thereof, and a display panel have been described in detail with embodiments provided by the present disclosure which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A color filter substrate, comprising a first substrate, a color resist layer, an overcoat layer, and a quantum dot layer, which are sequentially stacked along a first direction;
   wherein the color resist layer is provided with a plurality of sub-color resist layers with different colors arranged along a second direction, and there is no black matrix disposed between two adjacent sub-color resist layers; and
   the quantum dot layer is divided into a plurality of quantum dot areas arranged along the second direction, a plurality of banks are disposed between and correspond to two adjacent quantum dot areas, and the banks are black;
   wherein the banks have a predetermined transmittance t within a visible light range, the predetermined transmittance t of the banks is less than 5% when a wavelength of ambient light L is greater than 350 nm and less than 510 nm, and the predetermined transmittance t of the banks is greater than 90% when the wavelength of ambient light L is greater than 650 nm.

2. The color filter substrate of claim 1, wherein a material of the banks comprises a hydrophobic organic material, and the banks have a predetermined length along the first direction.

3. The color filter substrate of claim 2, wherein the predetermined length of the banks along the first direction is a first length L greater than 6 μm.

4. The color filer substrate of claim 1, wherein each of the quantum dot areas is divided into a first quantum dot area, a second quantum dot area, and a third quantum dot area.

5. The color filter substrate of claim 4, wherein a red quantum dot is disposed in the first quantum dot area, a green quantum dot is disposed in the second quantum dot area, and the third quantum dot area is not provided with a quantum dot.

6. The color filter substrate of claim 4, wherein a red quantum dot is disposed in the first quantum dot area, a green quantum dot is disposed in the second quantum dot area, and a transparent resin material is disposed in the third quantum dot area.

7. The color filter substrate of claim 4, wherein the sub-color resist layers comprise a first color resist layer, a second color resist layer, and a third color resist layer.

8. The color filter substrate of claim 7, wherein the first quantum dot area corresponds to the first color resist layer, the second quantum dot area corresponds to the second color resist layer, and the third quantum dot area corresponds to the third color resist layer.

9. The color filter substrate of claim 7, wherein the first color resist layer is a red color resist layer, the second color resist layer is a green color resist layer, and the third color resist layer is a blue color resist layer.

10. The color filter substrate of claim 1, wherein a material of the overcoat layer comprises a transparent organic material.

11. A display panel, comprising a luminescent device and the color filter substrate of claim 1 corresponding to the luminescent device, wherein the luminescent device emits blue light or white light.

12. The display panel of claim 11, wherein the luminescent device comprises a second substrate, a buffer layer, a first insulating layer, a passivation layer, a first overcoat layer, a pixel defining layer, a luminescent layer, an encapsulation layer, and a second overcoat layer, which are sequentially stacked along the first direction.

13. The display panel of claim 12, wherein a light-shielding layer, an active layer, a second insulating layer, and a first metal layer are disposed under the first insulating layer.

14. The display panel of claim 13, wherein a second metal layer is disposed in the passivation layer, and a source and a drain of the second metal layer are electrically connected to the active layer by a first through-hole and a second through-hole respectively, and an end of the drain is electrically connected to an anode by a third through-hole.

15. The display panel of claim 12, wherein an anode layer is disposed on a side of the first overcoat layer away from the passivation layer, and the anode layer is surrounded by the pixel defining layer.

16. The display panel of claim 15, wherein the luminescent layer is disposed on a side of the anode layer away from the second substrate, and the luminescent layer is surrounded by the pixel defining layer.

17. The display panel of claim 12, wherein the luminescent layer is an organic light-emitting diode (OLED) device or a liquid crystal display (LCD) device.

* * * * *